United States Patent
Gale et al.

(10) Patent No.: US 6,612,022 B1
(45) Date of Patent: Sep. 2, 2003

(54) PRINTED CIRCUIT BOARD INCLUDING REMOVABLE AUXILIARY AREA WITH TEST POINTS

(75) Inventors: Alan Andrew Gale, Carver, MA (US); Thomas Alden Fiske, Mansfield, MA (US); Simon Korowitz, Sharon, MA (US)

(73) Assignee: Invensys Systems, Inc., Foxboro, MA (US)

( * ) Notice: Subject to any disclaimer, the term of this patent is extended or adjusted under 35 U.S.C. 154(b) by 1247 days.

(21) Appl. No.: 08/646,735

(22) Filed: May 3, 1996

(51) Int. Cl.[7] ................................................. H05K 3/30
(52) U.S. Cl. ..................... 29/832; 29/840; 361/748; 361/760; 437/63; 209/564; 324/759; 174/68.5
(58) Field of Search ......................... 29/832, 834, 836, 29/840, 852; 361/748, 760; 437/63; 209/564; 324/759; 174/68.5

(56) References Cited

U.S. PATENT DOCUMENTS

| | | | | |
|---|---|---|---|---|
| 3,830,956 A | * | 8/1974 | Wootton et al. ............ | 174/68.5 |
| 4,426,773 A | * | 1/1984 | Hargis ........................... | 29/832 |
| 4,812,742 A | * | 3/1989 | Abel et al. ................. | 324/73 R |
| 5,031,073 A | * | 7/1991 | Chang ...................... | 29/832 X |
| 5,131,140 A | * | 7/1992 | Zimmer ..................... | 29/832 X |
| 5,258,323 A | * | 11/1993 | Sarma et al. .................. | 437/63 |
| 5,416,428 A | * | 5/1995 | Swart .......................... | 324/759 |
| 5,680,936 A | * | 10/1997 | Beers .......................... | 209/564 |
| 5,687,476 A | * | 11/1997 | Van Liere ................. | 29/830 X |

OTHER PUBLICATIONS

PCMCIA Process Selection, Circuits Assembly, Jul. 1994 (p. 30–33).

"Text Fixture Solutions for PC Cards," Jim O'Leary, TTI Testron Inc., Austin, TX.

* cited by examiner

Primary Examiner—Richard Chang
(74) Attorney, Agent, or Firm—David Barron; David J. Powsner

(57) ABSTRACT

A method for manufacturing a Personal Computer Memory Common Interface Architecture ("PCMCIA") printed circuit board ("PCB") includes providing a PCB having a PCMCIA area and an auxiliary area. The PCMCIA area has multiple locations adapted to receive electronic components. The auxiliary area has multiple test points disposed thereon. The method also includes populating the PCMCIA area with electronic components. Testing of the PCMCIA area is next performed by electrically contacting at least some of the multiple test points within said auxiliary area. If the testing produces unsatisfactory results, diagnostics and repair are performed. After the testing produces satisfactory results, the auxiliary area is separated from the PCMCIA area to produce a populated, tested, PCMCIA PCB.

5 Claims, 6 Drawing Sheets

PRINTED CIRCUIT BOARD INCLUDING REMOVABLE AUXILIARY AREA WITH TEST POINTS

TECHNICAL FIELD

The present invention relates, in general, to printed circuit board manufacturing. In particular, the present invention relates to methods and systems for manufacturing high-density printed circuit boards with increased numbers of test points.

BACKGROUND OF THE INVENTION

Current electronic product manufacturing technology includes the fabrication of a printed circuit board ("PCB"), the soldering of electronic components to the PCB, and the electrical testing of the completed PCB. One technique used in the above-summarized process involves the use of "test points". At various locations on the PCB, conductive pads (i.e., test points) are disposed, and connected to predetermined circuitry. After the PCB has been populated with components, electrical contact is made to the test points and appropriate testing is performed. As the number of test points is increased, more precise diagnostics can be performed, such that more efficient diagnostics and repair are facilitated.

The advent of higher density electronic packaging techniques, taken in connection with the decrease in size of PCBs, have made the above-described testing difficult. For example, Personal Computer Memory Common Interface Architecture ("PCMCIA") circuit cards use small, densely populated PCBs. Due to the complexity of these cards, many test points are required to fully facilitate testing. However, due to the small size and high parts density of these cards, locating free space to accommodate sufficient numbers of test points is difficult.

In particular, a PCMCIA PCB may be densely populated on one or both sides thereof. Little space is left on the board for test points. Furthermore, even if some test points could be allocated, they may be positioned such that automated test equipment can not reliably contact them. Even further, PCMCIA PCBs are thin (18–21 mils), and require mechanical support under any test points. Without mechanical support, electrical test probes might flex or penetrate the PCBs, ruining them. Unfortunately, the high densities of PCMCIA PCBs complicate mechanically supporting them during testing.

In view of the above, the testing and repair of PCMCIA PCBs are impaired. For example, testing using reduced numbers of test points does not produce very precise localization of malfunctioning aspects of the populated PCB. Further diagnostics, usually performed manually, are therefore necessary. Substantial expense is thus incurred in diagnosing and repairing these PCBs. Often, malfunctioning boards are simply discarded due to the high repair cost. Therefore, the lack of adequate numbers of test points on PCMCIA PCBs directly increases product costs.

The present invention is directed toward a solution to the above-noted problem.

DISCLOSURE OF THE INVENTION

In a first aspect, the present invention includes a method for manufacturing a printed circuit board ("PCB"). The method includes providing the PCB having a main area and an auxiliary area. The main area has at least one electronic component disposed thereon and the auxiliary area has at least one test point disposed thereon. The PCB is tested by electrically contacting the at least one test point. Thereafter, the auxiliary area is removed from the PCB.

As an enhancement, after the testing, the PCB may be repaired as a function of the testing. Further, testing and repair may be repeated until a desired level of functionality is achieved. During the testing, the PCB may be mechanically supported on a side opposite the at least one test point.

As a further enhancement, the auxiliary area may be removed by a cutting process using, e.g., a router, a laser or a water knife. Thereafter, at least one edge of the PCB created by said removing may be sealed using, e.g., a conformal insulative coating.

In another embodiment, the main area of the PCB corresponds to a PCMCIA PCB.

In yet another embodiment, the present invention includes a PCB having a main area and an auxiliary area. The main area is adapted to received at least one electronic component and the auxiliary area has at least one test point disposed thereon. The auxiliary area is contiguous with the main area and is removable therefrom by cutting. Further, the PCB includes at least one metallic trace disposed between and electrically contacting the at least one electronic component and the at least one test point for facilitating testing of the at least one electronic component by contacting the at least one test point.

As an enhancement, the PCB may include an internal wiring layer containing the at least one metallic trace. Further the PCB may have a thickness of less than 25 mils and the main area may be a PCMCIA PCB.

The present invention has many advantages and features associated with it. High testing visibility is provided to the circuitry of the populated PCB thereby enabling thorough testing. More efficient diagnosis and repair is facilitated thereby, and yields are therefore increased. Also, the use of test points in the auxiliary area allows for denser PCBs since no space is required in the main area for test points or mechanical stabilizers. Further, mechanical stress related PCB damage due to "main area" testing is reduced (e.g., solder joint cracking). Moreover, revisions to the PCB can be made without having to redesign a test fixture, thereby expediting time-to-market for new designs and lowering overall costs. Also, similar PCBs can be testing using a same test fixture; therefore, less test fixtures are needed, again lowering costs. In short, the techniques of the present invention advance the art of printed circuit board based product manufacturing.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which the same and similar reference numerals refer to the same and similar elements and:

DETAILED DESCRIPTION OF A PREFERRED EMBODIMENT

According to the present invention, artwork for a master PCB 11 from which two populated and tested PCMCIA PCBs (13 & 15) are formed is shown in FIGS. 1–4. The layout of master PCB 11 is organized such that many test points are provided. Thus, after populating master PCB 11 with components, particularized testing and diagnosis is facilitated. As a result, repairs are simplified, yields are increased, and costs are reduced.

Figure 1:
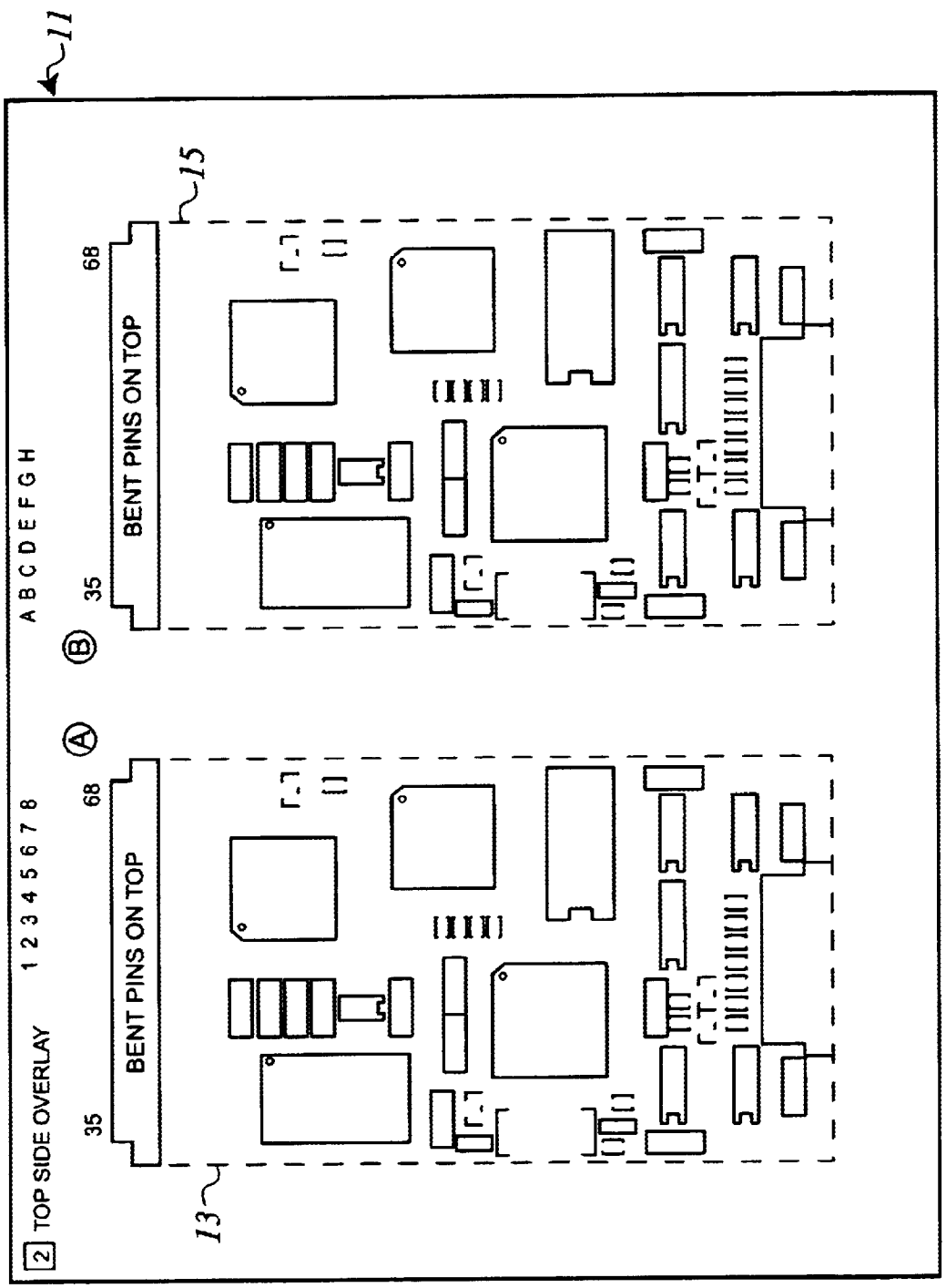
FIG. 1 depicts artwork for a top overlay view of a PCB pursuant to an embodiment of the present invention.

Turning to FIG. 1, depicted is the overlay artwork of a master PCB 11 from which a first PCMCIA PCB 13 and a second PCMCIA PCB 15 are fabricated. Two PCMCIA PCBs (13 and 15) are fabricated from a single: master PCB 11 to increase manufacturing efficiency. As will be explained in further detail hereinbelow, after population of the PCMCIA PCBs with components and associated testing and repair, PCMCIA PCBs 13 and 15 will be separated from master PCB 11 using, e.g., a router, laser or water knife. In other embodiments, less or more PCMCIA PCBs could be fabricated from a master PCB using the same and similar techniques as those disclosed herein.

By way of definition, the term "main area" of a PCB is defined herein as the areas of a master PCB that are used in the final PCB product that is included in the next level of assembly. For example, in the embodiment shown in FIG. 1, the main a PCBs 13 and 15. The term "auxiliary area" is defined herein as the master PCB area outside of the main area. For example, in the embodiment shown in FIG. 1, the auxiliary area is the area of master PCB 11 outside of PCMCIA PCBs 13 and 15.

Figure 2:
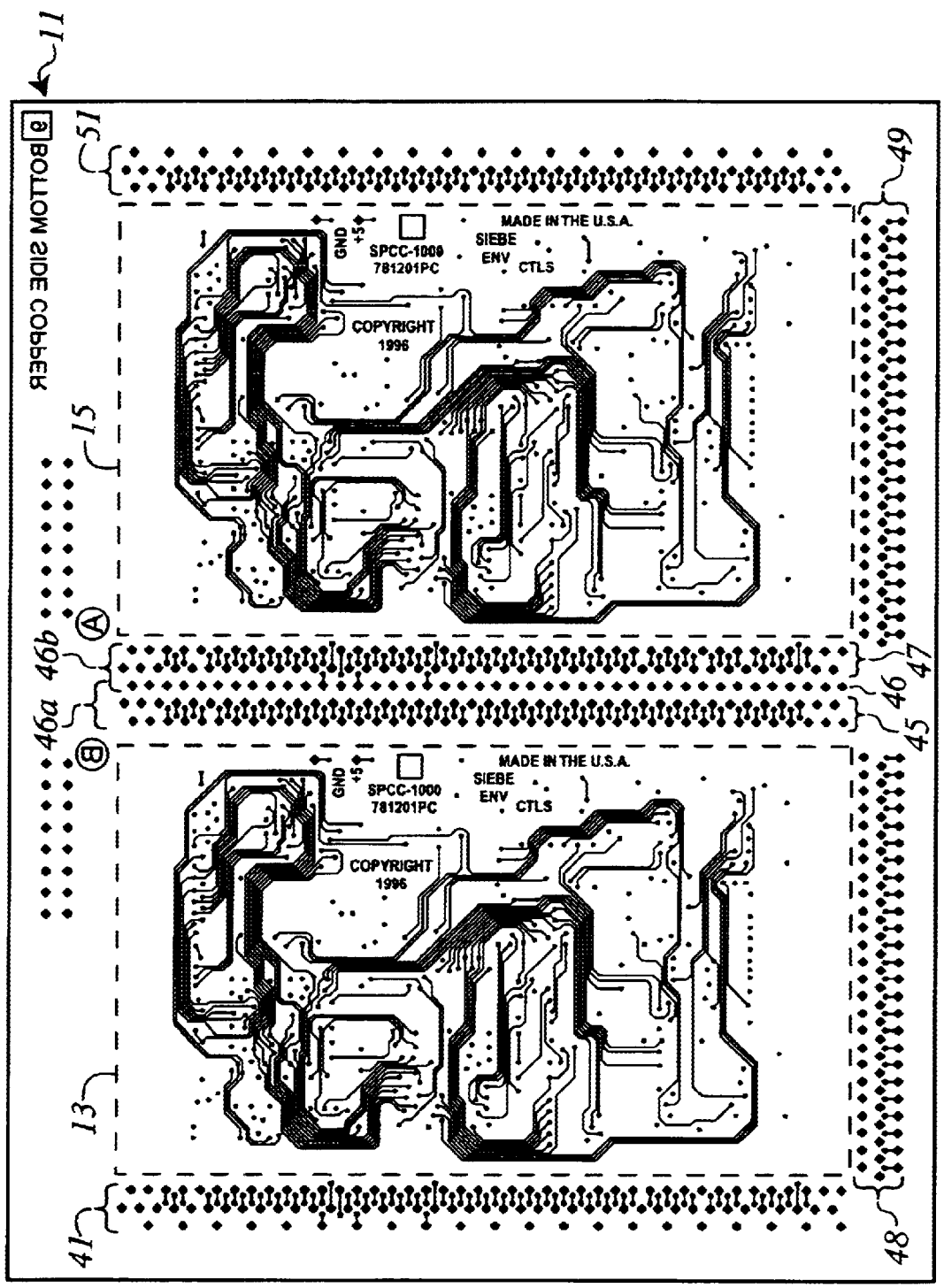
FIGS. 2–4 depict artwork for bottom, internal and top signal layers, respectively, of the PCB of FIG. 1.
Figure 3:
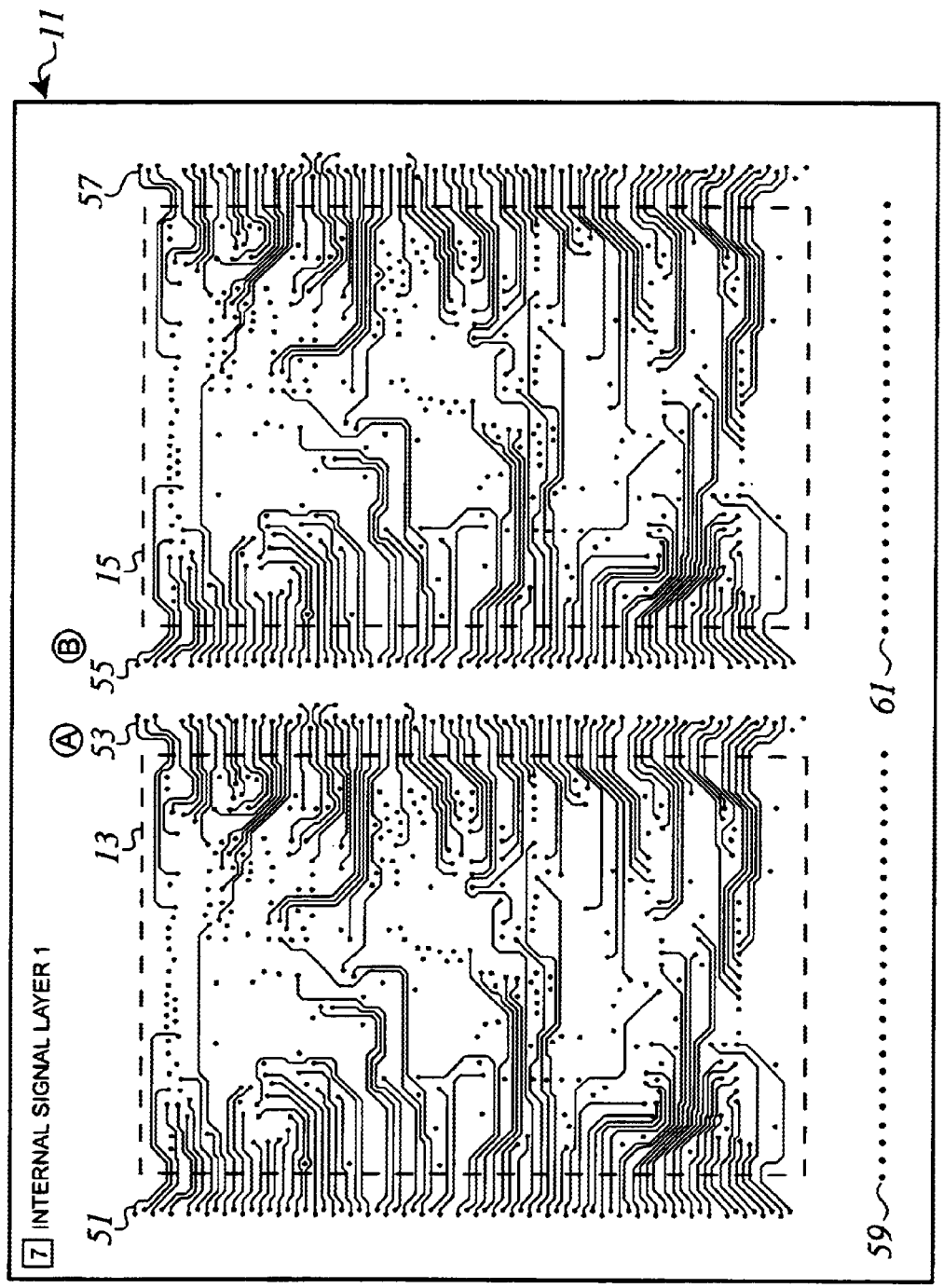
Figure 4:
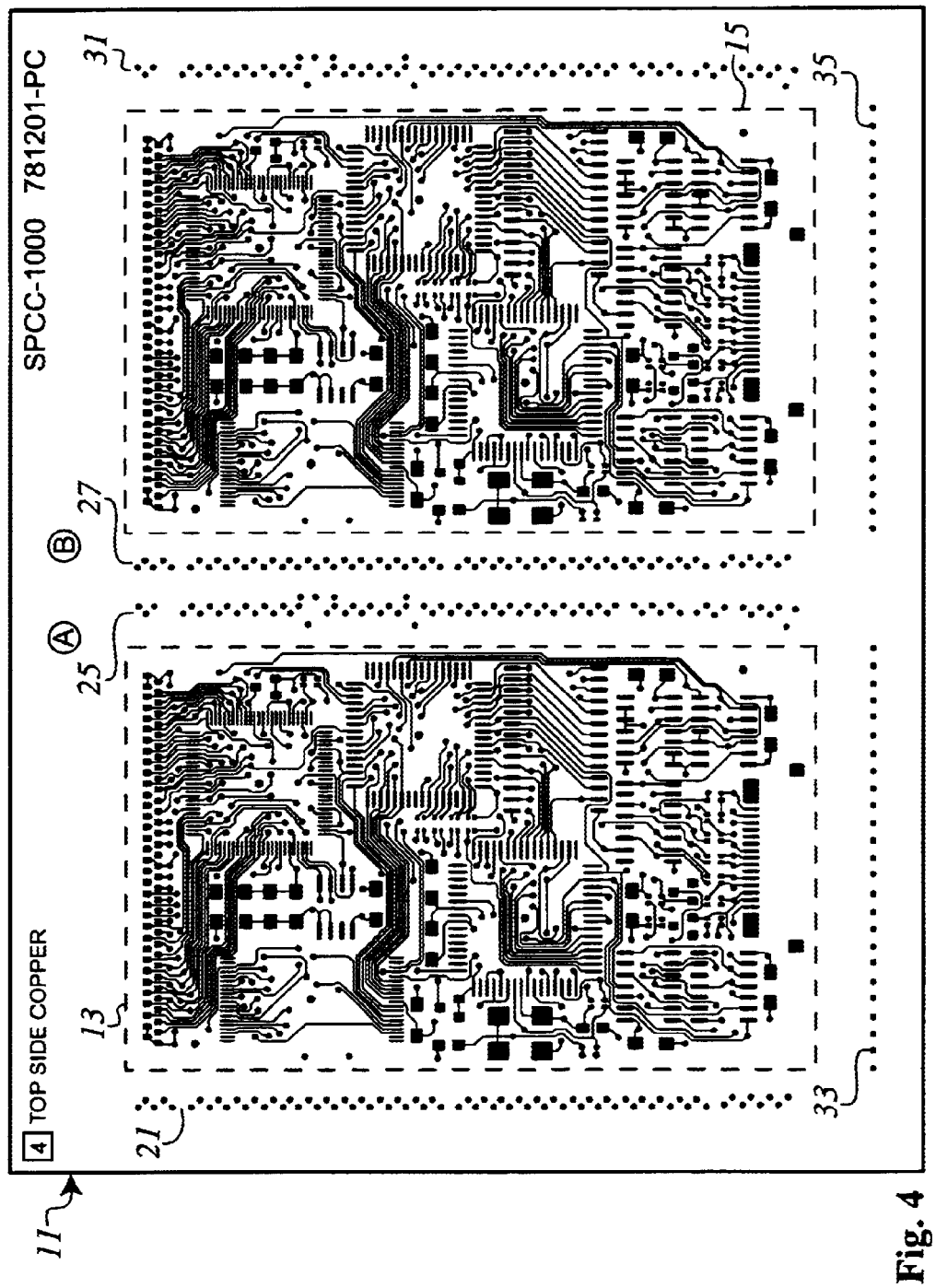

The location and configuration of test points for master PCB 11 are depicted in the PCB signal layer artwork of FIGS. 2–4. With reference to the bottom signal layer artwork of FIG. 2, the auxiliary area of master PCB 11 has test points groupings 41, 43, 45, 46, 47, 49 and 51 disposed therein. Each of the groupings is aligned with an edge of the substantially rectangular shape of PCMCIA PCBs 13 and 15. Further, each test point grouping is organized as multiple linear rows of test points. A high-density test point pattern is thus achieved. Test point groupings 41 and 51 are configured such that when superimposed, the two test points groupings align to form test point grouping 46. In other words test point group 46a is identical to group 51 and 46b is identical to group 41. In this way, the PCB design for individual PCMCIA PCBs 13 and 15 are identical, and can be further replicated across a larger master PCB without any interfering overlap.

Depicted in FIG. 3 is the artwork for an internal signal layer of master PCB 11 that contains PCMCIA PCBs 13 and 15. As shown, internal wiring connects multiple locations within the circuitry of the PCMCIA PCBs to test point feedthrough groupings 51, 53, 55, 57, 59, and 61. Vias connect these feedthroughs to the test points. In the depicted design, all the test points are not used and sufficient wiring space exists for using more test points. Although not needed in the current embodiment, additional internal wiring layers, or the use of external wiring layers, could facilitate further wiring to test points.

FIG. 4 depicts artwork for a top signal layer. Disposed within the auxiliary area of master PCB 11 are test point feedthrough groupings 21, 25, 27, 31, 33, and 35. These test points feedthrough groupings are disposed around, and aligned with, the main areas of master PCB 11. Each of the test point feedthroughs aligns with a test point (or with a short trace terminating at a test point) disposed opposite it on the bottom signal layer depicted in FIG. 2.

Figure 5:
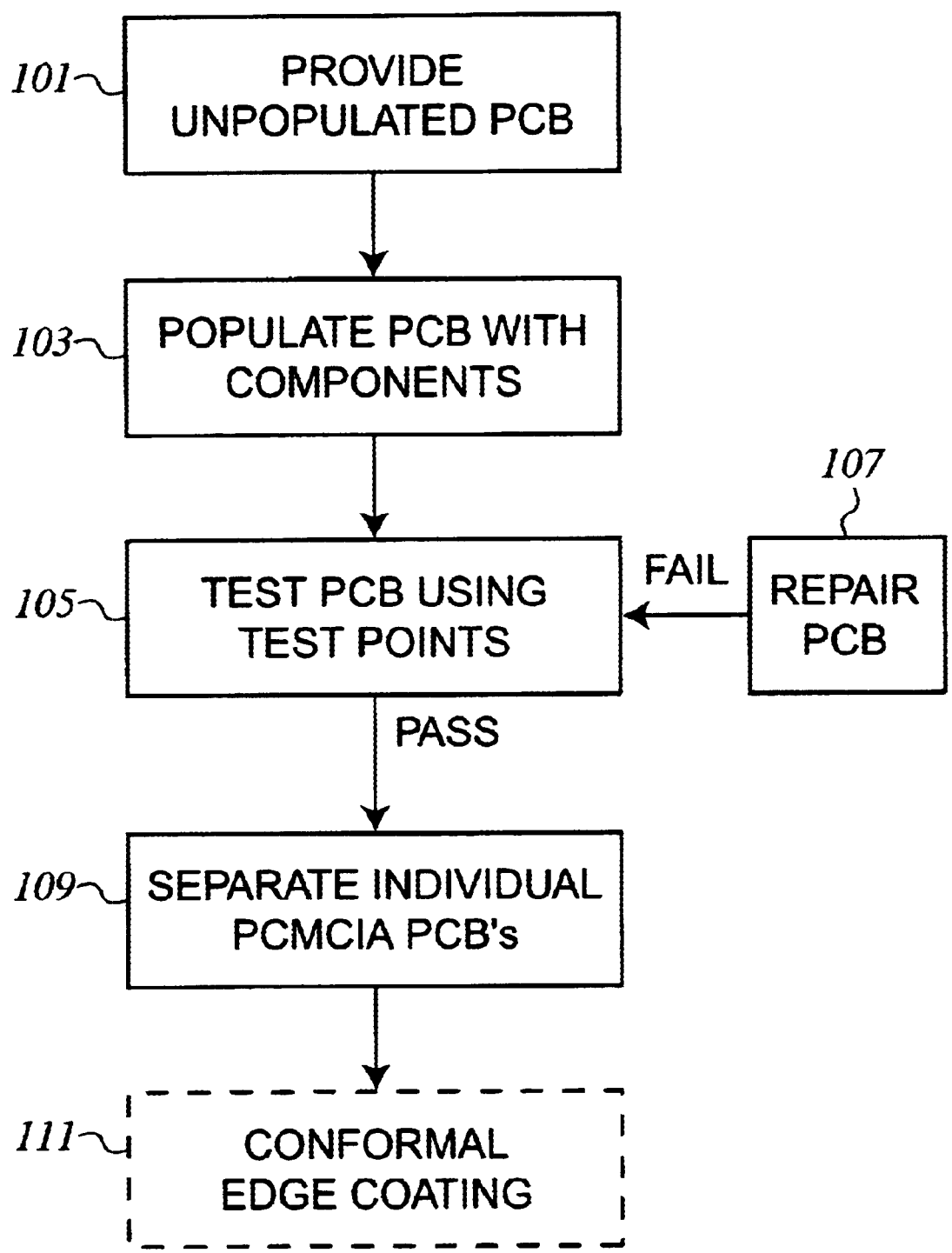
FIG. 5 is a flow-diagram of a method for manufacturing, populating and testing PCMCIA PCBs pursuant to an embodiment of the present invention.

In accordance with the present invention, a method for manufacturing PCMCIA PCBs is described below in connection with the flow-diagram of FIG. 5. To begin, an unpopulated master PCB is provided (e.g., master PCB 11 of FIG. 1), STEP 101. The master PCB is then populated with components using, e.g., conventional automatic placement and soldering techniques, STEP 103. Thereafter, the populated PCB is attached to a test fixture specifically designed to mate with test points configured according to the present invention, STEP 105 (e.g., see FIG. 6—discussed below). After testing is performed, the board is repaired to fix any problems, STEP 107. According to the techniques disclosed herein, the numerous test points facilitate very precise problem determination that should simplify repair of the PCB. The testing and repair cycle is repeated (STEPs 105 and 107) until functional circuitry is established.

Once acceptable functionality of the current assembly is established, the individual PCBs on the master PCB may be separated, STEP 109. In particular, a cutting process is used to separate the main area of the PCB from the auxiliary area. For example, with reference to FIG. 1, the two PCMCIA PCBs 13 and 15 may be separated from master PCB 11. The cutting process may be performed with, e.g., an automated router.

One limitation on the number of test points configurable within the auxiliary area of a master PCB relates to the spacing of traces routed between the main area and the auxiliary area. If the traces are too close together, dendrite growth on the PCB edge may cause shorts in the final PCB. In the current embodiment, using a router for separation, an intertrace spacing of 23 mils is sufficient to prevent shorts. Other techniques facilitate more dense trace spacing. For example, after separation of the main area from the auxiliary area, a conformal insulative coating could be applied to the edge of the main area PCBS, STEP 111. One example of a material useable for an edge conformal coating is 1A33 from HumiSeal, which can be applied using, e.g., a brushing or dipping process. Other techniques that can improve inter-area trace spacing density are "cleaner" separation techniques. For example, in place of a router, a water knife or laser may be used. Moreover, in the current embodiment, the power and ground planes are patterned such that they do not extend all the way to the edge of the PCMCIA PCBs. This way, they are not exposed on the edge, and the possibility of shorts therewith is eliminated.

Figure 6:
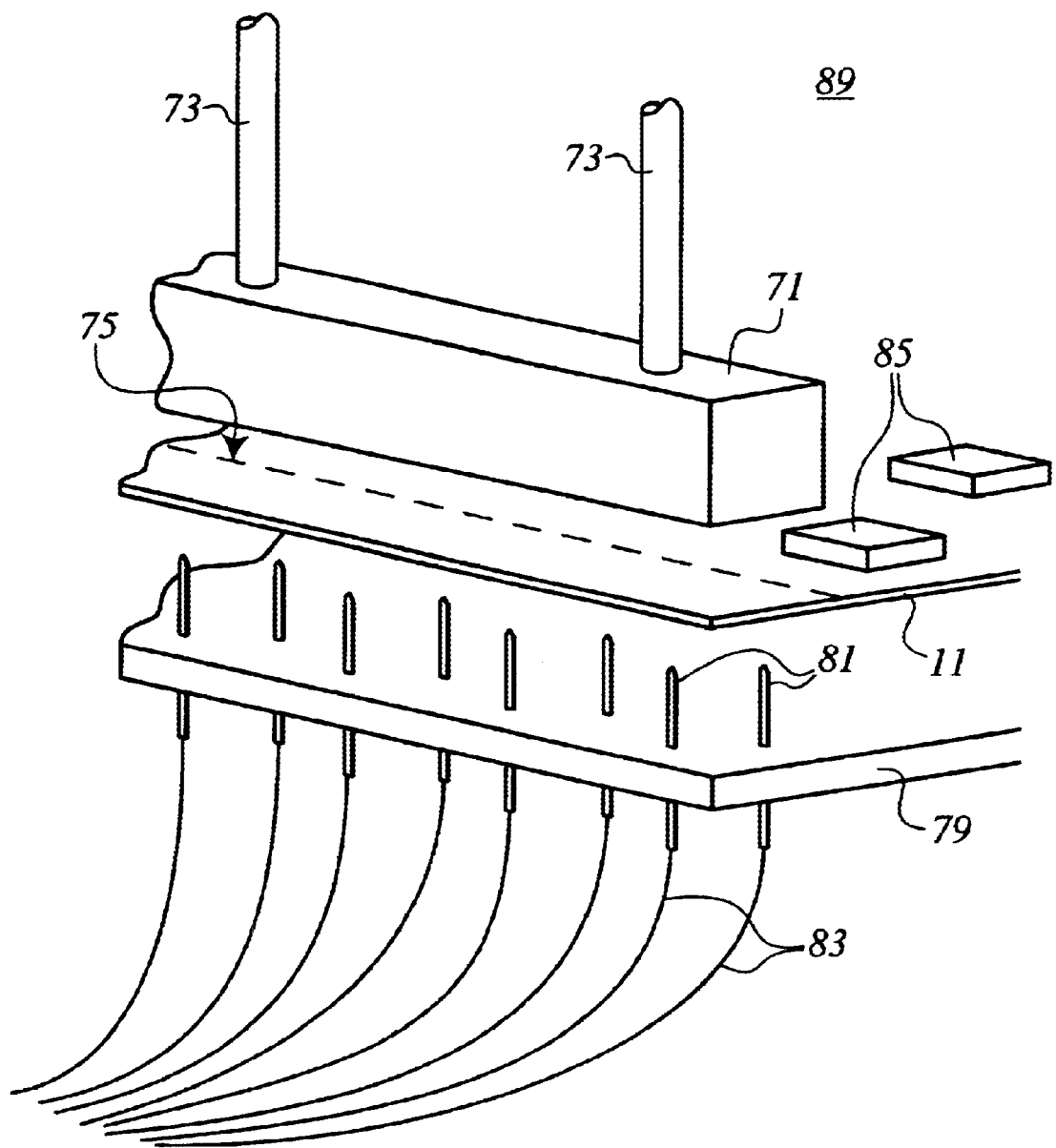
FIG. 6 depicts a test fixture for testing the PCB of FIG. 1 according to one embodiment of the present invention.

Turning to FIG. 6, a perspective view is shown of a test fixture 89 usable in connection with the techniques disclosed herein. A master PCB 11 having components 85 soldered thereto is placed into test fixture 89 for testing. A demarcation line 75 (illustrative) on master PCB 11 separates the main area from the auxiliary area. Multiple spring loaded test pins 81 are oriented such that they align with the test points on the underside of master PCB 11. Electrical wires 83 connect test pins 81 to, for example, automated test equipment. Above master PCB 11 is a backer bar 71 that is attached to a clamping mechanism 73. Backer bar 71 is aligned behind the test points contacted by test pins 81.

During testing, backer bar 71 is clamped down against master PCB 11, which contacts test pins 81 at its test points. Backer bar 71 prevents the net force of test pins 81 from flexing or puncturing master PCB 11. Further, backer bar 71 (or multiple backer bars) is configured to correspond to the arrangement of utilized master PCB test points. As backer bar 71 is disposed behind an auxiliary area of master PCB 11 that does not have components disposed thereon, there is no mechanical interference with the populated PCB. Similarly, as test pins 81 are disposed behind an auxiliary area of master PCB 11 that does not have components disposed thereon, there is no mechanical interference with the populated PCB (even if populated on both sides).

By way of example, although the master PCB described herein has linear test point groupings on three sides of the PCMCIA PCBs, other arrangements of test points are possible. For example, groupings of test points could be aligned with any number of edges of a PCB. Further, the groupings of test points could be organized as linear groupings of multiple rows as depicted, or could be organized in non-linear shapes. Moreover, although the techniques disclosed herein are described in connection with thin, high-density PCMCIA PCBs, they are applicable in connection with other sizes and types of PCBs.

As an enhancement to the techniques discussed herein, active and passive components could be placed in the auxilliary areas of the master PCB and used to aid in testing. For example, signal generators, voltage references and I/O circuitry could be used to condition signals from an automated tester, or to generate test signals themselves. After the auxilliary PCB area is removed, these components could be recovered or discarded.

To summarize, the present invention has many advantages and features associated with it. High testing visibility is provided to the circuitry of the populated PCB thereby enabling thorough testing. More efficient diagnosis and repair is facilitated thereby, and yields are therefore increased. Also, the use of test points in the auxiliary area allows for denser PCBs since no space is required in the main area for test points or mechanical stabilizers. Further, mechanical stress related PCB damage due. to "main area" testing is reduced (e.g., solder joint cracking). Moreover, revisions to the PCB can be made without having to redesign a test fixture, thereby expediting time-to-market for new designs and lowering overall costs. Also, similar PCBs can be testing using a same test fixture; therefore, less test fixtures are needed, again lowering costs. In short, the techniques of the present invention advance the art of printed circuit board based product manufacturing.

While the invention has been described in detail herein, in accordance with certain preferred embodiments thereof, many modifications and changes thereto may be affected by those skilled in the art. Accordingly, it is intended by the appended claims to cover all such modifications and changes as fall within the true spirit and scope of the invention.

I claim:

1. A method for manufacturing a printed circuit board ("PCB") comprising;
   (a) providing said PCB, said PCB having a main area and an auxiliary area, said main area having at least one electronic component disposed thereon, said auxiliary area having at least one test point disposed thereon;
   (b) testing said PCB by electronically contacting said at least one testpoint; and
   (c) removing said auxiliary area from said PCB,
   wherein said PCB has at least one edge created by said removing (c), and wherein said method further comprising sealing said at least one edge after said removing (c).

2. The method of claim 1, wherein said sealing comprising applying a conformal insulative coating to said at least one edge.

3. A method for manufacturing a PCMCIA printed circuit board ("PCB") comprising:
   (a) providing a PCB, said PCB having a PCMCIA area and an auxiliary area, said PCMCIA area having a plurality of locations adapted to receive a plurality of electronic components, said auxiliary area having a plurality of test points disposed thereon, said PCB providing electrical connectivity between at least one of said electronic components and at least some of said test points;
   (b) populating said PCMCIA area with said plurality of electronic components;
   (c) testing said PCMCIA area by electrically contacting at least some of said plurality of test points within said auxiliary area;
   (d) performing diagnostics and repair if said testing (c) produces unsatisfactory results; and
   (e) separating said auxiliary area from said PCMCIA area after said testing produces satisfactory results to produce a populated, tested, PCMCIA PCB.

4. The method of claim 3, wherein said PCB has two main surfaces, and wherein said populating comprises populating said PCMCIA area on said two main surfaces.

5. The method of claim 3, wherein said electically contacting comprises mechanically supporting said PCB on a side at a position opposite said at least one test point.

* * * * *